United States Patent
Kirimura et al.

(10) Patent No.: US 6,258,173 B1
(45) Date of Patent: Jul. 10, 2001

(54) FILM FORMING APPARATUS FOR FORMING A CRYSTALLINE SILICON FILM

(75) Inventors: Hiroya Kirimura; Kiyoshi Ogata, both of Kyoto (JP)

(73) Assignee: Nissin Electric Co. Ltd., Kyoto (JP)

( * ) Notice: Subject to any disclaimer, the term of this patent is extended or adjusted under 35 U.S.C. 154(b) by 0 days.

(21) Appl. No.: 09/236,347

(22) Filed: Jan. 25, 1999

(30) Foreign Application Priority Data

Jan. 29, 1998 (JP) .................................................. 10-017076

(51) Int. Cl.[7] .................................................. C23C 16/00
(52) U.S. Cl. .................. 118/719; 118/718; 118/723 MP; 118/723 EB; 118/723 FE; 118/723 FI
(58) Field of Search ..................................... 118/718, 719, 118/723 R, 723 VE, 723 CB, 723 EB, 723 MP, 723 FE, 723 FI, 723 MW, 723 ME, 723 MA, 723 MR, 723 E, 723 ER, 723 I, 723 IR, 723 AV; 156/345; 204/298.04, 298.05, 298.06, 298.24

(56) References Cited

U.S. PATENT DOCUMENTS

| | | |
|---|---|---|
| 4,401,506 | 8/1983 | Otsuka . |
| 5,234,843 | 8/1993 | Oyoshi et al. . |
| 5,284,544 * | 2/1994 | Mizutani et al. ..................... 156/345 |
| 5,344,796 | 9/1994 | Shin et al. . |
| 5,352,291 | 10/1994 | Zhang et al. . |
| 5,472,507 * | 12/1995 | Yamaguchi et al. .................. 118/722 |
| 5,654,043 * | 8/1997 | Shao et al. ............................ 427/527 |

FOREIGN PATENT DOCUMENTS

| | | |
|---|---|---|
| 19522923A1 | 3/1997 | (DE) . |
| 0 652 308A2 | 5/1995 | (EP) . |
| 57-160124 | 10/1982 | (JP) . |
| 1-231315 | 9/1989 | (JP) . |
| 2-260627 | 10/1990 | (JP) . |
| 4-206532 | 7/1992 | (JP) . |
| 5-55194 | 3/1993 | (JP) . |
| 6-260436 | 9/1994 | (JP) . |
| 7-221035 | 8/1995 | (JP) . |
| 9-208389 | 8/1997 | (JP) . |
| 10-149984 | 6/1998 | (JP) . |

OTHER PUBLICATIONS

"Fast Deposition of Amorphous and Microcrystalline Silicon Films from $SiH_2Cl_2$–$SiH_4$–$H_2$ by Plasma–Enhanced Chemical Vapor Deposition", Arai et al, Japanese Journal of Applied Physics, vol. 36, No. 7B, Part. 1, Jul. 1, 1997.
Patent Abstracts of Japan, vol. 14, No. 459, Oct. 4, 1990. Publication No. 02188499 (24–07–90).
Patent Abstracts of Japan, vol. 17, No. 152, Mar. 25, 1993. Publication No. 04318921 (10–11–1992).
Patent abstracts of Japan, vol. 95, No. 5, Jun. 30, 1995. Publication No. 07037822 (07–02–95).

* cited by examiner

*Primary Examiner*—Gregory Mills
*Assistant Examiner*—Luz L. Alejandro
(74) *Attorney, Agent, or Firm*—Arent Fox Kintner Plotkin & Kahn, PLLC (57) ABSTRACT

A film forming apparatus includes a silicon film forming vacuum chamber for forming a crystalline silicon film on a substrate; a film forming device provided for the vacuum chamber for forming a pre-film of the crystalline silicon film on a target surface of the substrate; and an energy beam irradiating device provided for the vacuum chamber for irradiating the pre-film with an energy beam for crystallizing the pre-film. This film forming apparatus produce a crystalline silicon film having a good quality as a semiconductor film for a TFT or the like with good productivity.

11 Claims, 2 Drawing Sheets

FILM FORMING APPARATUS FOR FORMING A CRYSTALLINE SILICON FILM

The invention is based on patent application No. 10-17076 Pat. filed in Japan, the contents of which is hereby incorporated by reference.

BACKGROUND OF THE INVENTION

1. Field of the Invention

The present invention relates to a film forming apparatus for forming a crystalline silicon film, which is used, e.g., as a material of a TFT (Thin-Film Transistor) switch provided for each pixel in a liquid crystal display, an integrated circuit, a solar battery and others, and for forming, if necessary, an electrical insulating film such as a silicon compound film in addition to the crystalline film.

The present invention also relates to a method of forming a crystalline silicon film.

2. Description of the Background Art

Amorphous silicon films have been used as semiconductor films for TFTs and others because amorphous silicon films having large areas can be made at a low temperature. However, it is now desired to provide crystalline silicon films having a crystal grain diameter of 200 nm or more and, particularly, about 300 nm or more for improving transistor characteristics and forming devices integrally provided with drive circuits.

The crystalline silicon film can be formed by several methods. For example, it may be formed by a thermal CVD method in which a substrate, i.e., a work or an object on which the film is to be formed or deposited, is heated to a high temperature of 600° C. or more, and the film is formed by the thermal CVD under normal or reduced pressure. In another method, the crystalline silicon film is formed by a PVD method such as a vacuum deposition or sputter deposition while keeping the substrate at a temperature of about 700° C. or more. In a still another method, an amorphous silicon film is formed by appropriate CVD or PVD at a relatively low temperature, and then is crystallized by post-treatment, which is heat treatment effected on the amorphous silicon film at a temperature of 800° C. or more, or is heat treatment effected thereon at a temperature of about 600° C. for a long time of about 20 hours or more. Further, such a method may be employed that laser annealing is effected on an amorphous silicon film for crystallizing the same.

Among these methods, the laser anneal method, in which the laser annealing is effected on the amorphous silicon film for crystallizing the same, can produce the crystalline silicon film at a lower temperature than the other methods. Therefore, substrates to be processed in the laser anneal method are not restricted to materials such as quartz having a high melting point, and the method can be employed for materials such as glass which are relatively inexpensive and have a low melting point. Further, the laser annealing itself can be performed within a relatively short time, which improves an efficiency of formation of the crystalline silicon films.

However, formation of the amorphous silicon film and the laser annealing are usually performed in different apparatuses, respectively, and the substrate coated with the film is once moved into an atmosphere for bringing the substrate and film into a laser irradiation apparatus.

In some cases, an electrical insulating film such as a silicon compound film is formed before or after formation of the amorphous silicon film. The insulating film is usually formed in another apparatus. Therefore, it is difficult to keep clean boundaries or interfaces between the respective films, and therefore it is difficult to provide good device characteristics. In addition, long times are required for transportation of the substrate between the apparatuses and repetitive heating of the substrate, resulting in a low throughput.

According to the method in which the amorphous silicon film is irradiated with a laser beam, the laser must have a very high energy density for providing the crystalline silicon film having a crystal grain diameter of a practically required value of 200 nm or more and, more preferably, a value of 300 nm or more. For this, the laser irradiation apparatus must have a high power. Accordingly, an expensive apparatus is required, and the laser beam emitted with a high power becomes unstable, resulting in reduction in productivity.

Since the amorphous silicon film contains a large amount of hydrogen mixed thereinto, the quality of the film would be impaired due to bumping of hydrogen if the film were irradiated with the laser beam as it was. Therefore, heat treatment must be effected on the amorphous silicon film formed on the substrate for removing the hydrogen, and thus time-consuming processing is required.

Many dangling bonds are present in the crystalline silicon film which is formed by crystallizing the amorphous silicon film. For obtaining good device characteristics, therefore, the dangling bonds must be filled with hydrogen by exposing the crystalline silicon film to hydrogen plasma, which also requires time consuming processing.

In the method of crystallizing the amorphous silicon film by laser beam irradiation, the laser must have an extremely high energy density for producing the crystalline silicon film having a crystal grain diameter of a practically allowable value, as already described. However, the vacuum deposition, sputter deposition and others cannot form the amorphous silicon films having a sufficiently high adhesion to the substrate. Therefore, local separation of the film is liable to occur due to a stress which occurs in the film during the laser annealing.

In the case where the amorphous silicon film is formed by the vacuum deposition, sputter deposition or the like, it is difficult to control the grain diameter of the crystal which is formed by the later crystallizing processing. Therefore, the finally produced film may not have a sufficiently large crystal grain diameter, or may have an excessively large grain diameter, resulting in irregularities on grain boundaries and thus a large surface roughness of the film.

SUMMARY OF THE INVENTION

Accordingly, it is an object of the invention to provide a film forming apparatus, which can form a crystalline silicon film used as a semiconductor film for a TFT or the like, and having a good quality with high productivity as well as a method of forming such a crystalline silicon film.

Another object of the invention is to provide a film forming apparatus, which can form a crystalline silicon film used as a semiconductor film for a TFT or the like, and having a good quality on a substrate with a good adhesion as well as a method of forming such a crystalline silicon film.

Still another object of the invention is to provide a film forming apparatus, which can form a crystalline silicon film used as a semiconductor film for a TFT or the like, and having a good quality and a predetermined crystal grain diameter as well as a method of forming a crystalline silicon film.

A further object of the invention is to provide a film forming apparatus which can form a crystalline silicon film of a good quality used as a semiconductor film for a TFT or the like as well as an electrical insulating film such as a silicon compound film layered on the crystalline silicon film, and more specifically can form the films with good productivity while sufficiently suppressing defects in boundary surfaces of these films.

The invention provides a film forming apparatus including a silicon film forming vacuum chamber for forming a crystalline silicon film on a substrate; a film forming device provided for the vacuum chamber for forming a pre-film of the crystalline silicon film on a target surface of the substrate; and an energy beam irradiating device provided for the vacuum chamber for irradiating the pre-film with an energy beam for crystallizing the pre-film.

The invention also provides a crystalline silicon film forming method including the steps of preparing a film forming apparatus having a silicon film forming vacuum chamber for forming a crystalline silicon film on a substrate, and provided with a film forming device for forming a pre-film of the crystalline silicon film on a target surface of the substrate, and an energy beam irradiating device for irradiating the pre-film with an energy beam for crystallizing the pre-film; locating the substrate in the silicon film forming vacuum chamber, and forming the pre-film of the crystalline silicon film on the target surface of the substrate by the film forming device; and producing the intended crystalline silicon film from the pre-film by irradiating the pre-film in the vacuum chamber with the energy beam for crystallization of the pre-film emitted from the energy beam irradiating device subsequently to the formation of the pre-film.

According to the invention, the formation of the pre-film of the crystalline silicon film and the subsequent irradiation of the pre-film with the energy beam can be continuously performed in the same vacuum chamber. Therefore, the time required for transporting the substrate as well as the time required for heating the substrate can be significantly reduced so that the throughput can be improved. Further, since the formation of the pre-film and the irradiation with the energy beam can be performed in the same vacuum chamber, it is possible to produce the crystalline silicon film having a good quality while suppressing adhesion of impurity and others.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

According to an embodiment of the invention, a film forming apparatus includes a silicon film forming vacuum chamber for forming a crystalline silicon film on a substrate; a film forming device provided for the vacuum chamber for forming a pre-film of the crystalline silicon film on a target surface of the substrate; and an energy beam irradiating device provided for the vacuum chamber for irradiating the pre-film with an energy beam for crystallizing the pre-film.

In addition, according to an embodiment of the invention, a crystalline silicon film forming method includes the steps of preparing a film forming apparatus having a silicon film forming vacuum chamber for forming a crystalline silicon film on a substrate, and provided with a film forming device for forming a pre-film of the crystalline silicon film on a target surface of the substrate, and an energy beam irradiating device for irradiating the pre-film with an energy beam for crystallizing the pre-film; locating the substrate in the silicon film forming vacuum chamber, and forming the pre-film of the crystalline silicon film on the target surface of the substrate by the film forming device; and producing the intended crystalline silicon film from the pre-film by irradiating the pre-film in the vacuum chamber with the energy beam for crystallization of the pre-film emitted from the energy beam irradiating device subsequently to the formation of the pre-film.

According to the film forming apparatus and the crystalline silicon film forming method described above, the formation of the pre-film of the crystalline silicon film and the subsequent irradiation of the pre-film with the energy beam can be continuously performed in the same vacuum chamber. Therefore, the time required for transporting the substrate as well as the time required for heating the substrate can be significantly reduced so that the throughput can be improved. Further, since the formation of the pre-film and the irradiation with the energy beam can be performed in the same vacuum chamber, it is possible to produce the crystalline silicon film having a good quality while suppressing adhesion of impurity and others.

The film forming device may form the pre-film directly on the target surface, i.e., the surface on which the crystalline silicon film is to be formed, of the substrate, or may form the pre-film on the target surface on which an electrical insulating film or the like is already formed.

The film forming device (in other words, the silicon film forming vacuum chamber) may be provided with an ion source for emitting an ion beam to the substrate. In this case, the film forming device may be a plasma CVD device, a sputtering device or the like.

Thereby, the film can be formed on the substrate by the plasma CVD method or the like, and further the ion beam can be emitted thereto. By appropriately selecting or controlling the ion species, ion emission energy and others, effects such as surface excitation, improvement of crystallinity and control of crystalline orientation are achieved, and migration of silicon atoms is promoted, and the silicon film having good crystallinity can be formed on the substrate at a relatively low temperature. In this case, it is preferable that the ion source can emit the ion beam with an emission energy of about 100 eV to about 1 keV.

The pre-film formed in the above manner can have a predetermined crystal grain diameter of about 10 nm or more, and it is possible to reduce the energy density of the energy beam to be emitted thereafter for obtaining the crystalline silicon film having a practically required crystal grain diameter.

The substrate may be irradiated with an ion beam prior to formation of the pre-film, or may be irradiated with an ion beam during an initial stage of formation of the pre-film. In the case where the ion beam is emitted prior to the formation of the pre-film, the substrate can have a microcrystalline nucleus layer on its surface during formation of the pre-film, and the pre-film thus formed can have an upper layer which is an amorphous silicon layer. In the case where the ion beam is emitted during the initial stage of formation of the pre-film, it is possible to form the pre-film having such a microcrystalline nucleus layer, or the pre-film having a mixture layer, which is mixed with the substrate, on the boundary with respect to the substrate and an upper layer which is an amorphous silicon layer.

The microcrystalline nucleus layer of silicon can be formed by employing the ion source, which can emit the ion beam with an emission energy of about 500 eV to about 10 keV. The mixture layer of the substrate and the pre-film can be formed by employing the ion source, which can emit the ion beam with an emission energy of about 2 keV to about 10 keV.

Existence of the mixture layer thus formed improves the adhesion between the substrate and the pre-film so that local or partial separation of the film is unlikely to occur even if a large internal stress subsequently occurs in the film due to irradiation with the energy beam from the energy beam irradiation device. Therefore, it is possible to increase the energy density of the energy beam, which expands the available range of the energy density.

In the case where the microcrystalline nucleus layer is to be formed, the crystal grain diameter and the density of the microcrystalline nucleuses as well as the thickness and others of the microcrystalline nucleus layer may be controlled, whereby it is possible to control the crystal grain diameter of the crystalline silicon film, which will be formed later, as well as irregularities (concavities and convexities) and other of the crystal grain boundaries, and therefore the silicon film which is finally formed can have good crystallinity without unpreferable surface roughness.

The small crystal grain diameter of the microcrystalline nucleus allows use of not only the energy beam having a high energy density for crystallization but also the energy beam having a lower energy density. By controlling the grain diameter and others of microcrystalline nucleuses in the microcrystalline nucleus layer, therefore, it is possible to grow crystals with the energy beam of an energy density selectable from a wide range between high and low energy densities. Accordingly, the output of the energy beam can be controlled with a relatively low precision, and the energy beam of a low energy density can be used so that a cost of an energy beam irradiation device can be reduced, and the lifetime of the device can be increased.

For emitting the energy beam of a high energy density, the energy beam irradiation device must have a high power, which increases a cost of the device. Also, the laser beam emitted with a high power becomes unstable so that uniform crystals cannot be grown without difficulty. In contrast to this, the crystal grain diameter of the microcrystalline nucleus layer can be kept small, and it is possible to use the energy beam in the output region of the relatively low and stable energy density. Accordingly, it is possible to produce the crystalline silicon film having uniform crystal grain diameters and a smooth surface.

As described above, the irradiation with the ion beam may not be performed over the entire period for forming the prefilm of the crystalline silicon film, but may be performed only in the initial stage of the above period or before the same so that the microcrystalline nucleus layer is formed in the restricted portion, i.e., the boundary between the pre-film and the substrate. In this case, silicon crystals having uniform grain diameters grow during the subsequent crystallizing process so that it is possible to reduce defects (irregularities) in the surface of the finally produced crystalline silicon film. In addition, the crystallizing process grows the crystal grains around the nucleuses formed of the microcrystals. Therefore, defects in the crystal grains of the entire film can be reduced.

In the film forming apparatus provided with the ion beam irradiation device, irradiation with the ion beam can be performed in one of the foregoing methods. In this case, it is preferable to select and control the ion species, ion emission energy, dose and others so as to provide the pre-film having a hydrogen concentration of about $3 \times 10^{21}$ pcs/cm$^3$ or less. Thereby, it is possible to suppress impairment of the film quality, which may be caused by bumping of hydrogen during irradiation with the energy beam, without requiring dehydrogenation processing such as heating before the irradiation with energy beam. This improves the productivity.

If the film forming device forms the film in the CVD method such as a plasma CVD method using a film material gas, the film material gas may be a silicon-contained gas such as a silicon hydride gas [e.g., mono-silane ($SiH_4$) gas or disilane ($Si_2H_6$) gas], a silicon fluoride gas [e.g., silicon tetrafluoride ($SiF_4$) gas] or a silicon chloride gas [e.g., silicon tetrachloride gas ($SiCl_4$)], and may also be a gas containing such a gas. In addition to the above silicon-contained gas, a gas containing a hydrogen ($H_2$) gas may be used.

Addition of the hydrogen gas into the film material gas promotes reaction of the hydrogen with silicon atoms and/or molecules of $SiH_n$ (n=1, 2 or 3) ejected by decomposition of the silicon-contained gas. Thereby, dangling bonds in the silicon-silicon network and defects in the film are suppressed.

As the ion species of the ion beam, the ion source can emit ions of at least one kind of gas among inert gases (e.g., helium (He) gas, neon (Ne) gas, argon (Ar) gas, krypton (Kr) gas or xenon (Xe) gas), reactive gases (e.g., hydrogen ($H_2$) gas, fluorine ($F_2$) gas, hydrogen fluoride (HF) gas) and the silicon-contained gases already described as the film material gas. Ions of inert gases having a mass number equal to or larger than that of argon gas ion are not used if such ions may impair the film to be formed, and/or may impede formation of the prefilm of an intended quality so that voids or defects may occur in the film during the subsequent crystallization by irradiation with the energy beam.

Irradiation with the inert gas ions described above allows control of physical excitation for crystallization. When using the gases, which contain hydrogen (H) and/or fluorine (F), among the reactive gases and the silicon-contained gases described above, hydrogen atoms and/or fluorine atoms are bound with silicon atoms in the amorphous phase of the film, and vaporizes the same. Thereby, crystallization of silicon is promoted, and dangling bonds in the silicon-silicon network and defects in the film are reduced. Accordingly, by continuously irradiating the pre-film with the ion beams during the formation of the pre-film, it is possible to form the silicon pre-film having a further improved crystallinity.

The energy beam irradiation device may typically have a structure which can emits a laser (laser beam) such as KrF laser, XeCl laser and Ar ion laser. In addition, it may have a structure which can emit an electron beam and others.

The film forming apparatus may have such a structure that the film forming device provided for the vacuum chamber for silicon film formation can form the film over a length, in a predetermined first direction, of the target surface of the substrate (in this case, the ion beam irradiation device, if arranged, irradiates the target surface over the length in the first direction with the ion beam), that the energy beam irradiation device can irradiate the target surface of the substrate over the length in the first direction with the energy beam, and that a substrate transporting device is arranged in the silicon film forming vacuum chamber for moving the substrate in a second direction crossing (and usually perpendicular to) the first direction.

In the foregoing method of forming the crystalline silicon film, the film forming device may employ such a structure that the pre-film can be formed over the length, in the first direction, of the target surface of the substrate, and the energy beam irradiation device may employ such a structure that can irradiate the target surface of the substrate over the length in the first direction with the energy beam. The intended crystalline silicon film can be successively formed by operating the film forming device to form continuously the pre-film in the first direction on the target surface of the substrate, and concurrently operating the energy beam irradiation device to irradiate the formed pre-film with the energy beam while moving the substrate in the second direction crossing the first direction.

According to the film forming apparatus and the film forming method described above, a region which is irradiated with the energy beam by the energy beam irradiation device may have a square form or a linear form, which extends over the length, in the first direction, of the target surface of the substrate.

When forming the crystalline silicon film by the above apparatus and the above film forming method, the substrate transporting device moves the substrate in the second direction of the target surface in the silicon film forming vacuum chamber, whereby the pre-film can pass through the energy beam irradiation region while the pre-film is being formed on the target surface of the substrate, and thereby the crystalline silicon film can be successively formed. Owing to this manner, the crystalline silicon film can be formed on the target surface of the substrate with a higher throughput even if the substrate has an elongated form.

The film forming apparatus according to the invention may have such a structure that a vacuum chamber for forming an electrical insulating film such a silicon compound film (e.g., silicon oxide film, silicon nitride film or the like) is connected to the silicon film forming vacuum chamber via a connection hermetically sealed against an external. According to this structure, it is possible to form, before forming the crystalline silicon film in the silicon film forming vacuum chamber and/or after forming the crystalline silicon film, the electrical insulating film, which forms a layered structure on the substrate together with the crystalline silicon film and contains no or only a suppressed amount of boundary defects caused by adhesion of impurity and others to the film interface. Since the formation of the crystalline silicon film and the formation of the electrical insulating film can be performed continuously without losing the vacuum condition, it is possible to avoid deposition of a natural oxide film, moisture, organic matters and other onto the film surface so that the substrate which is coated with the crystalline silicon film having good device characteristics can be obtained.

The film forming apparatus according to the invention may be provided with a preheating vacuum chamber for preheating the substrate to a film forming temperature before the film formation. The preheating vacuum chamber is connected to the silicon film forming vacuum chamber via a connection hermetically sealed against an exterior. Also, a preliminary vacuum chamber allowing external transportation of the substrate may be connected to the silicon film forming vacuum chamber via a connection hermetically sealed against an exterior. The film forming apparatus according to the invention may be provided with only one preliminary vacuum chamber for carrying in and out the substrate, or may be provided with different preliminary vacuum chambers for carrying in and carrying out the substrate, respectively.

Each of the electrical insulating film forming vacuum chamber, the preheating vacuum chamber and the preliminary vacuum chamber(s) for carrying in and/or out the substrate may be directly connected to the silicon film forming vacuum chamber, or may be connected thereto via another vacuum chamber. In summary, the connection(s) to the silicon film forming vacuum chamber is merely required to be hermetically sealed against the exterior.

The foregoing vacuum chambers may be connected together via valves capable of hermetically sealing the corresponding chambers, respectively, and may be arranged in the order of, e.g., the preliminary vacuum chamber for carrying in the substrate, the vacuum chamber for preheating, the vacuum chamber for forming the silicon film, the vacuum chamber for forming the electrical insulating film and the preliminary vacuum chamber for carrying out the substrate. In this case, the substrate is successively transported through the foregoing chambers by the substrate transporting means for forming the crystalline silicon film on the substrate and forming the insulating film overlying the same. Each chamber may be connected via a valve to a vacuum chamber for substrate transportation provided with the substrate transporting robot. In this case, the substrate is successively transported to the respective chambers via the substrate transporting vacuum chamber for forming the crystalline silicon film and the electrical insulating film. The substrate transporting vacuum chambers may be two or more in number.

Preferred embodiments of the invention will be described below with reference to the drawings.

Figure 1:
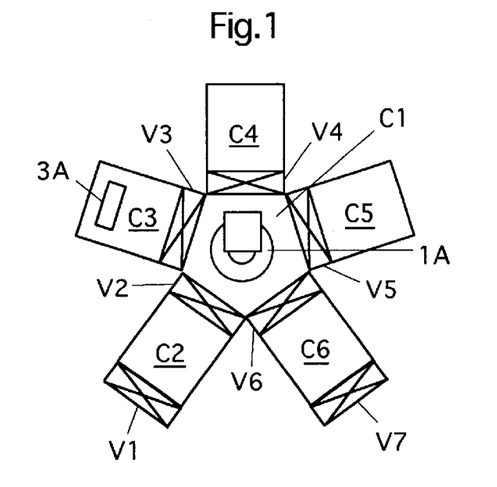
FIG. 1 schematically shows an example of a structure of a film forming apparatus according to the invention.

FIG. 1 shows a schematic structure of a film forming apparatus according to the invention which can execute the method of the invention. This apparatus has a substrate transporting vacuum chamber C1 for transporting a substrate, which is connected to a preliminary vacuum chamber C2 for carrying in the substrate from an exterior, a preheating vacuum chamber C3 for preheating the substrate, a first film forming vacuum chamber (silicon film forming vacuum chamber) C4 for forming a crystalline silicon film, a second film forming vacuum chamber (electrical insulating film forming vacuum chamber) C5 for forming an electrical insulating film, and a preliminary vacuum chamber C6 for carrying out the substrate via gate valves V2, V3, V4, V5 and V6, respectively. Gate valves V1 and V7 are interposed between the substrate inlet vacuum chamber C2 and the exterior, and between the substrate outlet vacuum chamber C6 and the exterior, respectively.

Although not shown, these vacuum chambers are connected to respective vacuum exhaust devices or a common vacuum exhaust device. A substrate transporting robot 1A is arranged in the substrate transporting vacuum chamber C1. A heating device 3A is arranged in the preheating vacuum chamber C3 for heating the substrate to a film forming temperature. A plasma CVD device, an ion source and a laser irradiation device are arranged for the first film forming vacuum chamber C4. Although not shown in FIG. 1, these devices are the same as those in a film forming apparatus, which will be specifically described later with reference to FIG. 4, except for some modifications applied to a substrate inlet portion, a substrate outlet portion and others. Although not shown, second film forming vacuum chamber C5 in this embodiment is provided with a plasma CVD device.

For forming the crystalline silicon film and the electrical insulating film on the substrate by the film forming apparatus shown in FIG. 1, the exhaust device exhausts an air or gas from chambers C1, C3, C4 and C5 and reduces the pressures therein to predetermined levels. The substrate is first carried into the preliminary vacuum chamber C2 through the opened valve V1. Then, the valve V1 is closed, and the air is exhausted from chamber C2 to attain the pressure substantially equal to that in the chamber C1. Then, the valves V2 and V3 are opened, and the substrate is carried into the preheating vacuum chamber C3 by the substrate transporting robot 1A in the substrate transporting vacuum chamber C1. Then, the valves V2 and V3 are closed. In the chamber C3, the heating device 3A heats the substrate to a temperature equal or close to a predetermined film forming temperature. Then, the valves V3 and V4 are opened, and the substrate transporting robot 1A transports the substrate from the chamber C3 into the first film forming vacuum chamber C4. After closing the valves V3 and V4, a pre-film of the crystalline silicon film is formed on the substrate by the plasma CVD and ion beam irradiation in the chamber C4. Subsequently, the pre-film is crystallized by irradiation with the laser beam to form the crystalline silicon film. The valves V4 and V5 are then opened, and the substrate transporting robot 1A transports the substrate from the chamber C4 into the second film forming vacuum chamber C5. After closing the valves V4 and V5, a film such as a silicon oxide film is formed on the crystalline silicon film by the plasma CVD in the chamber C5. Then, the valves V5 and V6 are opened, and the substrate transporting robot 1A transports the substrate coated with the crystalline silicon film and, e.g., the silicon oxide film into the substrate outlet preliminary vacuum chamber C6, from which the air is already exhausted to attain the pressure substantially equal to that in the chamber C1. The valves V5 and V6 are then closed, the vacuum chamber C6 is returned to the atmospheric pressure, and the substrate is carried out through the opened valve V7. Thereafter, the valve V7 is closed.

According to this film forming apparatus, the preheating of the substrate, formation of the pre-film of the crystalline silicon film, crystallization with laser beam and formation of the electrical insulating film can be successively performed without exposing the substrate to the atmosphere. Therefore, deposition of the natural oxide film, moisture and organic matters onto the film boundary surface is avoided, and it is possible to produce the substrate coated with the crystalline silicon film or the like having good device characteristics. Since these processes can be performed continuously, times required for transporting and heating the substrate can be significantly reduced, and therefore the throughput is improved. In particular, formation of the pre-film of the crystalline silicon film and the subsequent irradiation with the energy beam can be performed in the same vacuum chamber, which further improves the throughput.

Figure 2:
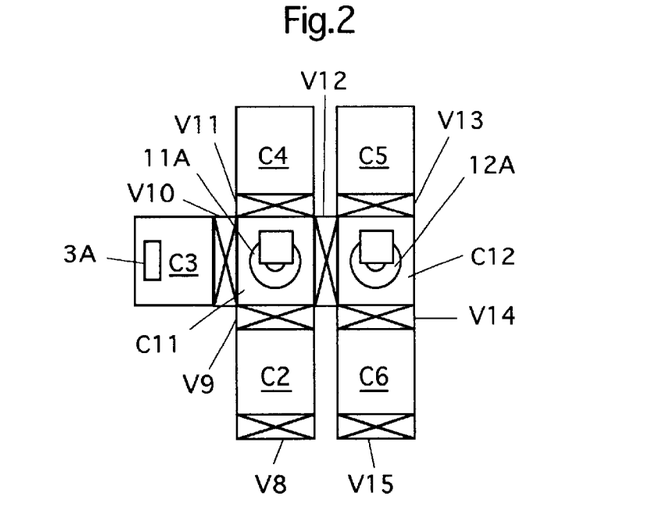
FIG. 2 schematically shows another example of a structure of a film forming apparatus according to the invention.

FIG. 2 shows a schematic structure of another example of the film forming apparatus according to the invention. This apparatus has two vacuum chambers C11 and C12 for transporting the substrate. The vacuum chamber C11 is connected to the preliminary vacuum chamber C2 for substrate transportation, the preheating vacuum chamber C3 and the first film forming vacuum chamber C4 for forming the crystalline silicon film via gate valves V9, V10 and V11, respectively. The vacuum chamber C12 for substrate transportation is connected to the second film forming vacuum chamber C5 for forming the electrical insulating film and the preliminary vacuum chamber C6 for transporting the substrate via gate valves V13 and V14, respectively. The substrate transportation vacuum chambers C11 and C12 are connected together via a gate valve V12. Gate valves V8 and V15 are arranged between the substrate inlet preliminary vacuum chamber C2 and the exterior, and between the substrate outlet preliminary vacuum chamber C6 and the exterior, respectively.

Each of the vacuum chambers in FIG. 2 is substantially the same as the corresponding vacuum chamber in FIG. 1. Substrate transporting robots arranged in the vacuum chambers C11 and C12 for substrate transportation are indicated by references "11A" and "12A", respectively.

For forming the crystalline silicon film and others on the substrate by the film forming apparatus shown in FIG. 2, the substrate is successively moved through the substrate inlet preliminary vacuum chamber C2, substrate transporting vacuum chamber C11, preheating vacuum chamber C3, substrate transporting vacuum chamber C11, first film forming vacuum chamber C4, substrate transporting vacuum chamber C11, substrate transporting vacuum chamber C12, second film forming vacuum chamber C5, substrate transporting vacuum chamber C12 and substrate outlet preliminary vacuum chamber C6. Thereby, preheating of the substrate, formation of the pre-film of the crystalline silicon film, crystallization with the laser beam and formation of the insulating film are successively performed similarly to the apparatus shown in FIG. 1.

Figure 3:
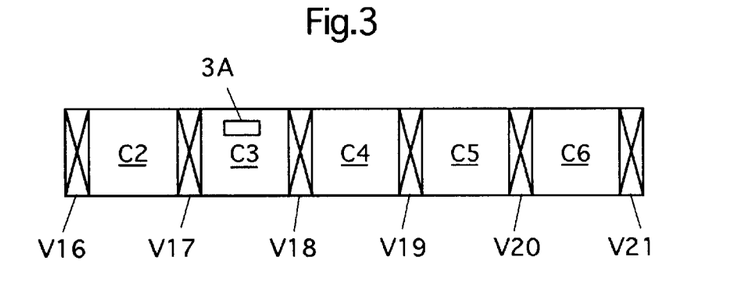
FIG. 3 schematically shows still another example of a structure of a film forming apparatus according to the invention.

FIG. 3 shows a schematic structure of still another example of the film forming apparatus according to the invention. The film forming apparatus includes the substrate inlet preliminary vacuum chamber C2, preheating vacuum chamber C3, first film forming vacuum chamber C4 for forming the crystalline silicon film, second film forming vacuum chamber C5 for forming the electrical insulating film and substrate outlet preliminary vacuum chamber C6, which are connected together via gate valves V17, V18, V19 and V20. Gate valves V16 and V21 are arranged between the substrate inlet preliminary vacuum chamber C2 and the exterior, and between the substrate outlet preliminary vacuum chamber C6 and the exterior. The respective vacuum chambers are the substantially same as those in the apparatus in FIG. 1.

For forming the crystalline silicon film and others on the substrate by the apparatus shown in FIG. 3, the substrate is successively moved through the substrate inlet preliminary vacuum chamber C2, preheating vacuum chamber C3, first film forming vacuum chamber C4, second film forming vacuum chamber C5 and substrate outlet preliminary vacuum chamber C6. Thereby, preheating of the substrate, formation of the pre-film of the crystalline silicon film, crystallization with the laser beam and formation of the insulating film are successively performed similarly to the apparatus shown in FIG. 1.

Figure 4:
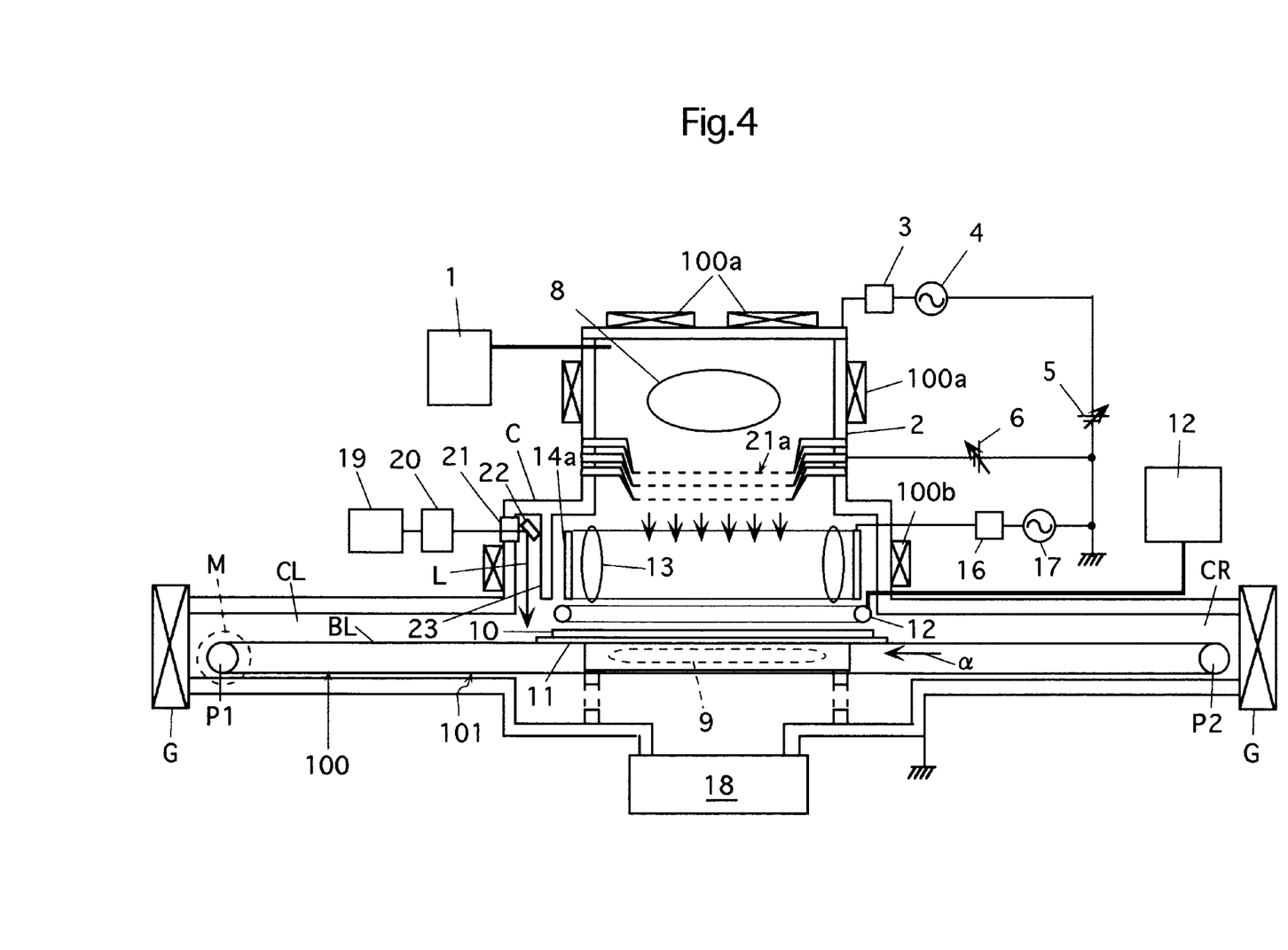
FIG. 4 schematically shows yet another example of a structure of a film forming apparatus according to the invention.

FIG. 4 shows a schematic structure of yet another example of the film forming apparatus according to the invention. This apparatus includes a plasma producing chamber C which is connected to a vacuum exhaust device 18 and a material gas supply portion 12. The material gas supply portion 12 includes a ring-shaped gas jet pipe 121 for supplying the film material gas into a lower region within a cylindrical electrode 14a having a circular or rectangular section and located in the chamber C, and also includes a material gas source, a mass-flow controller and others. Among them, however, only the ring-shaped gas jet pipe 121 is shown in the figure. In the chamber C, there is arranged a substrate holding member 11, which is guided by a guide (not shown) and can be horizontally reciprocated by a drive device 100 for moving the substrate 10 in a direction of an arrow α in the figure. In the chamber C, the member 11 is disposed on a heater 9 for heating the substrate. Although not restricted to the following structure, the drive device 100 includes a belt transmission device 101 which is continuously arranged in the lower portion of the plasma producing chamber C, and extends between left and right transportation chambers CL and CR each having a horizontally elongated form. The drive device 100 also includes a motor M, which is arranged outside the chamber for forwardly and reversely driving the belt transmission device 101. The belt transmission device 101 is formed of pulleys P1 and P2 arranged in the chambers CL and CR, respectively, and a belt BL retained around them. The belt BL is coupled to the holding member 11, and the pulley P1 is coupled to the motor M.

The cylindrical electrode 14a having a circular or rectangular section is arranged in the position which is opposed to the periphery of the film formation region of the substrate 10 held by the holding member 11 located in the plasma producing chamber C. The electrode 14a is connected to a high-frequency power source 17 through a matching box 16. A magnet 100b which applies a magnetic field for stably maintaining the plasma is arranged in the position around the plasma producing chamber C corresponding to the electrode 14a. An ion source 2 is opposed to the holding member 11 with the electrode 14a therebetween. The ion source 2 is connected to the ion source gas supply portion 1, and is electrically connected to a high-frequency power source 4 through a matching box 3 for forming the plasma from the gas. A magnet 100a is arranged around the ion source 2 which applies a magnetic field for stably maintaining the plasma. The gas supply portion 1 likewise includes a gas source and others, which are not shown in the figure. The ion source 2 has an ion beam producing electrode system 21a formed of three electrodes, i.e., an acceleration electrode, a deceleration electrode and a ground electrode, which are arranged in this order from the inner side of the ion source, for producing ions. An acceleration power source 5 and a deceleration power source 6 are connected between the ion beam producing electrode system 21a and the ion source 2. Although the manner of exciting the ion source 2 described above is of a high-frequency type, other types such as a filament type and a microwave type may be employed. Although the derivation electrode system 21a is formed of the three electrodes, it may be formed of one, two, four or more electrodes). The electrode 14a and the ion source 2 have sizes which allow the film formation and the ion beam irradiation over the length of the target surface of the substrate 10 in a first direction, which is a widthwise direction perpendicular to the substrate transporting direction α in this embodiment.

Outside the plasma producing chamber C, there is arranged a laser source 19 and an optical system 20 for determining a range irradiated with the laser light (laser beam) emitted from the laser source 19. A mirror 22 for reflecting the laser light to a predetermined position is arranged between the electrode 14a and the wall of the plasma producing chamber C. A quartz window 21 is arranged between the mirror 22 and the optical system 20. The mirror 22 and a path of the laser light L are covered with a protection plate 23 for intercepting the plasma and ion beams. In FIG. 4, G represents a gate valve provided in each of the transportation chambers CL and CR for carrying in or out the substrate.

An example of a manner of forming the crystalline silicon film by the foregoing apparatus will now be described below.

First, the vacuum exhaust device 18 operates to reduce the pressure in the plasma producing chamber C to a predetermined value. The material gas supply portion 12 supplies the material gas containing the silicon-contained gas and the hydrogen-contained gas into the plasma producing chamber C, and the high-frequency power source 17 supplies a high-frequency power to the electrode 14a through the matching box 16. Thereby, the gas introduced into the chamber C is changed into the plasma. Thus, the plasma is formed in a position 13 in FIG. 4 which will neighbor to the periphery of the target region of the substrate 10 located on the holding member 11 in the plasma producing chamber C.

In this manner, the substrate 10 is exposed to the plasma for depositing the film on its surface, and the film forming surface is irradiated with the ion beams in the following manner. The material gas of ions is introduced into the ion source 2 from the ion source gas supply portion 1, and a high-frequency power is supplied thereto from the power source 4 through the matching box 3. Thereby, the plasma is generated in the position 8 within the ion source, and an appropriate voltage is applied to the ion beam producing electrode system 21a from the power sources 5 and 6 so that ion beams are produced from the plasma 8 by the emission energy of 100 eV to 10 keV, and the ion beams are applied to the substrate 10 through the opening in the electrode 14a. The ion species of the ion beams are made of at least one kind of gas among the inert gas, reactive gas and silicon-contained gas. If the same material gas is used in the plasma producing chamber C and the ion source 2, either the gas supplied into the plasma producing chamber C from the material gas supply portion 12 or the gas supplied into the ion source 2 from the gas supply portion 1 may be used also for the other.

During the above processing, the drive device 100 moves the substrate 10 held by the holding member 11 in the lengthwise direction α so that the entire target surface of the substrate 10 passes through the film forming position under the electrode 14a. In the film forming position, the substrate 10 is laid on the heater 9 together with the holding member 11 holding the same. Thereby, the crystalline silicon pre-film is successively formed on the entire area of the substrate 10 starting from one end thereof in the lengthwise direction.

The laser source 19 applies the laser light (laser beam) L to the substrate 10 through the optical system 20, quartz window 21 and mirror 21 while moving the substrate 10. Thereby, the laser light (laser beam) is successively applied to the portion of the substrate 10, on which the pre-film is already formed, so that the pre-film is crystallized.

As described above, the plasma CVD device, ion source and laser irradiation device are arranged for the single vacuum chamber C, and the means for horizontally moving the substrate 10 is employed. Therefore, formation of the pre-film and crystallization thereof can be successively effected on one end and the following portions of the substrate 10 even if the substrate 10 has an elongated form, and consequently the crystalline silicon film can be formed with a high throughput. Further, formation and crystallization of the pre-film can be performed in the same plasma producing chamber C. Therefore, the crystalline silicon film having a good quality can be formed while suppressing adhesion of impurity and others.

In the process of forming the film on the substrate by the plasma CVD method or the like, and irradiating the same with the ion beams, the ion species, ion emission energy and others may be appropriately selected or controlled, whereby effects such as surface excitation, improvement of the crystallinity and control of crystalline orientation are achieved, and migration of silicon atoms is promoted so that the pre-film having a good crystallinity can be formed on the substrate at a relatively low temperature. Thereby, it is possible to lower the energy density of the energy beam to be emitted for forming the crystalline silicon film having a practically required crystal grain diameter.

The irradiation with ion beams can reduce a concentration of hydrogen in the pre-film, and dehydrogenation processing before the irradiation with laser light (laser beam) can be eliminated, which improves the productivity.

By using the gas containing a hydrogen gas as the plasma material gas, dangling bonds in the silicon film can be reduced so that the pre-film and therefore the crystalline silicon film having less defects therein can be formed without hydrogen-plasma processing.

Instead of the manner in which the formation of the film on the substrate by the plasma CVD method and the irradiation with the ion beams are performed in parallel with each other, such a manner may be employed that the irradiation with the ion beams is performed prior to the formation of the film, and thereafter the film formation is performed to form the pre-film, which has a microcrystalline nucleus layer on the boundary with respect to the substrate as well as an upper layer formed of an amorphous silicon layer. In this case, the substrate 10 is entirely irradiated with the ion beams by moving the substrate 10 in its lengthwise direction, and then the substrate 10 is returned to the initial position. Subsequently, the film is formed entirely on the substrate by moving the same in the lengthwise direction again, and the regions already coated with the film are concurrently and successively irradiated with the laser light for crystallization.

The ion beam may be emitted for a period from a stage before the pre-film formation to the initial stage of the pre-film formation, or only in the initial stage of the pre-film formation, and thereafter only the formation of the pre-film is performed without emitting the ion beams. In this case, the pre-film may have a microcrystalline nucleus layer of silicon located on the boundary with respect to the substrate as well as an upper layer formed of an amorphous silicon layer. As another structure, the pre-film may have a mixture layer containing the substrate material and located on the boundary with respect to the substrate as well as an upper layer formed of an amorphous silicon layer. Further, the pre-film may have a mixture layer and a microcrystalline nucleus layer similar to the foregoing layers as well as an amorphous silicon layer located on them. In this case, the film formation and the ion beam irradiation are effected on the entire area of the substrate by moving the substrate in its lengthwise direction, and then the irradiation with the ion beam stops, and the substrate is returned to the initial position. Then, the film formation is effected on the entire area while moving the substrate in the lengthwise direction, and the crystallization is concurrently performed by successively irradiating the regions coated with the film with the laser light (laser beam).

In the above manner, the ion beam irradiation is not performed throughout the period of the pre-film formation, but is performed only in the initial stage and/or before the film formation so that the microcrystalline nucleus layer of silicon is restricted to the boundary between the pre-film and the substrate. This manner can reduce defects (irregularities) on the surface of the finally produced crystalline silicon film, and can also reduce the defects in the crystal grains.

By controlling the crystal grain diameters or the like of the microcrystalline nucleus layer, the energy beam which can grow the good crystals can be selected from a wide range from a low energy density to a high energy density. Therefore, it is not required to increase the precision of the output of energy beams to a high extent so that the cost of the apparatus can be reduced, and the lifetime of the apparatus can be increased.

Since the stable energy beam of a low energy density can be used for crystallization, it is possible to produce the crystalline silicon film having a stable quality at a low cost.

The mixture layer formed on the boundary with respect to the substrate 10 can improve the adhesion between the pre-film and the substrate 10 so that separation or abrasion of the film can be suppressed even if the irradiation with the energy beam in the later crystallizing step causes a large stress in the film.

Although not restricted to the followings, the first film forming vacuum chamber C4 in each of the apparatuses in FIGS. 1 and 2 corresponds to the structure, in which an air-tight walls is employed instead of the gate valve G of the transportion chamber CL on the left side in FIG. 4, and the gate value G of the right transportion chamber CR is replaced with the gate valve V4 in the apparatus shown in FIG. 1 or the gate valve V11 in the apparatus shown in FIG. 2. Although not restricted thereto, the first film forming vacuum chamber C4 in the film forming apparatus shown in FIG. 3 corresponds to the structure, in which the gate valve G of the transportion chamber CR on the left in the film forming apparatus shown in FIG. 4 is replaced with the gate valve V18 shown in FIG. 3, and the gate valve G of the transportation chamber CL on the left in FIG. 4 is replaced with the gate valve G19 shown in FIG. 3.

In the film forming apparatus already described with reference to FIG. 4, the energy beam irradiation device formed of the laser source 19, optical system 20 and others is arranged only in one fixed position. However, it may be movable with respect to the substrate. Further, two or more energy beam irradiation devices may be employed.

The high-frequency electrode 14a may have a form other than the cylindrical forms described before.

Description will now be given on a practical example of continuous formation of the crystalline silicon film and the silicon oxide film by the film forming apparatus shown in FIG. 1. In addition, description will be given on a comparative example, in which an amorphous silicon film is formed by a parallel-plated plasma CVD device (plasma CVD device of capacity coupling type) in the prior art, dehydrogenation and crystallization by irradiation with laser light are effected on the amorphous silicon film to form the crystalline silicon film, and a silicon oxide film is formed on the crystalline silicon film by another parallel-plated plasma CVD device.

In each of the following examples, the film formation was executed 50 times on respectively new substrates.

In the following examples, the layer thickness of microcrystalline nucleus layer (i.e., a range containing microcrystalline nucleuses) was measured by a transmission electron microscope (TEM), and the crystal grain diameter of the crystalline silicon film was obtained from peak positions in laser Raman spectroscopic analysis and a result of observation with a scanning electron microscope (SEM). The density of microcrystalline nucleuses in the microcrystalline nucleus layer was measured from observation with the scanning electron microscope. Boundary cleanability of the finally produced crystalline silicon film and the silicon oxide film was evaluated by impurity analysis with an SIMS (secondary ion mass spectrometer). Electrical characteristics were determined by measuring hole mobilities.

PRACTICAL EXAMPLE

The apparatus in FIG. 1 was used. A film was formed on the substrate by exposing the substrate to plasma of a film material gas in the first film forming vacuum chamber C4. In the initial stage of this film formation, the target surface was irradiated with ion beams to form the pre-film of the crystalline silicon film on the substrate, and the pre-film was crystallized by irradiation with laser beam. The substrate coated with the crystalline silicon film was carried into the second film forming vacuum chamber C5 without losing the vacuum condition, and a silicon oxide film was formed on the crystalline silicon film in the chamber C5 by the plasma CVD method.

Conditions for Forming Pre-Film of Crystalline Silicon Film

| | | |
|---|---|---|
| Substrate | non-alkali glass substrate (300 mm × 400 mm) | |
| Film material gas | $SiH_4$ | 50% |
| | $H_2$ | 50% |
| High-frequency for excitation | 13.56 MHZ, 1.5 kW | |
| Ion source | ion species | positive ions of H and $SiH_x$ |
| | ion emission energy | 1 kev |
| | ion irradiation dose | $1 \times 10^{14}$–$1 \times 10^{15}$ pcs/cm$^2$ |
| Film forming pressure | $1 \times 10^{-4}$ Torr | |
| Film forming temperature | 300° C. | |
| Thickness of ion irradiated layer | 30 nm | |
| Whole layer thickness | 50 nm | |
| Conditions for Crystallization | | |
| Laser light | excimer laser (XeCl), wavelength = 308 nm | |
| Energy density | 100 mJ/cm$^2$–400 mJ/cm$^2$ | |
| Process temperature | 300° C. | |
| Conditions for Forming Silicon Oxide Film (continuous processing) | | |
| Film material gas | $SiH_4$ | 20% |
| | $N_2O$ | 80% |
| High-frequency for excitation | 13.56 MHZ, 2 kw | |
| Film forming pressure | $1 \times 10^{-3}$ Torr | |
| Film forming temperature | 300° C. | |
| Film thickness | 40 nm | |

According to the above example, microcrystalline nucleuses contained in the pre-film of the crystalline silicon film before laser annealing were present in a range within 30 nm from the surface of the substrate, and the density of microcrystalline nucleuses was about $1.0 \times 10^{10}$ pcs/cm$^2$. No microcrystalline nucleus was found in the upper layer, and it was confirmed that the upper layer was an amorphous silicon layer.

In the film after the laser annealing, peaks (Raman shift= 520 cm$^{-1}$) provided by the crystalline silicon were detected in the energy density range of the laser light from 100 mJ/cm$^2$ to 400 mJ/cm$^2$. From the result of the SEM observation, it was confirmed that the crystals having grain diameters of about 150 nm or more were formed. Crystals having grain diameters of 300 nm were confirmed in the energy density range from 230 mJ/cm$^2$ to 320 mJ/cm$^2$. In the energy density range from 200 mJ/cm$^2$ to 300 mJ/cm$^2$, the half-width with the Raman shift of 520 cm$^{-1}$ was 6 cm$^{-1}$, and it can be understood that the produced silicon film had a high degree of order and good crystallinity. In the single crystal, the half-width with the Raman shift of 520 cm$^{-1}$ was 5 cm$^{-1}$. If the laser energy density was 350 mJ/cm$^2$ or more, the crystal grain diameter was 300 nm or less, but separation or abrasion of the film due to laser light irradiation did not occur.

The time required for performing 50 times the film formation was 500 minutes. Boundary cleanability of the finally produced crystalline silicon film and the silicon oxide film was evaluated by impurity analysis with the SIMS, and it was found that the impurity concentration of carbon in the film was $1 \times 10^{17}$ pcs/cm$^3$, and the impurity concentration of carbon in the boundary between the films was $2 \times 10^{17}$ pcs/cm$^3$. The hole mobility was 50 cm$^2$/V·s.

COMPARATIVE EXAMPLE

Under the following conditions, an amorphous silicon film was formed by a conventional parallel-plated plasma CVD apparatus, and thereafter dehydrogenation and crystallization were performed. Further, a silicon oxide film was formed on the crystalline silicon film by the conventional parallel-plated plasma CVD apparatus.

Conditions for Forming Amorphous Silicon Film

| | | |
|---|---|---|
| Substrate | non-alkali glass substrate (300 mm × 400 mm) | |
| Film material gas | $SiH_4$ | 50% |
| | $H_2$ | 50% |
| High-frequency for excitation | 13.56 MHZ, 500 W | |
| Film forming pressure | $1 \times 10^{-1}$ Torr | |
| Film forming temperature | 300° C. | |
| Film thickness | 50 nm | |
| Conditions for Dehydrogenation | | |
| Process temperature | 450° C. | |
| Process time | 2 hours | |
| Atmosphere | atmospheric pressure, nitrogen atmosphere | |
| Conditions for Crystallization | | |
| Laser light | excimer laser (XeCl) of 308 nm in wavelength | |
| Energy Density | 100 mJ/cm$^2$–400 mJ/cm$^2$ | |
| Process Temperature | 300° C. | |
| Conditions for Forming Silicon Oxide Film (process after exposure to atmosphere) | | |
| Film material gas | $SiH_4$ | 20% |
| | $N_2O$ | 80% |
| High-frequency for excitation | 13.56 MHZ 1 kW | |
| Film forming pressure | $1 \times 10^{-1}$ Torr | |
| Film forming temperature | 300° C. | |
| Film thickness | 40 nm | |

In the above comparative example, the film before the laser annealing was a complete amorphous film, in which no microcrystalline nucleus was found. In the film after the laser annealing, peaks (Raman shift=520 cm$^{-1}$) provided by the crystalline silicon were detected in the energy density range of the laser light from 150 mJ/cm$^2$ to 400 mJ/cm$^2$. From the result of the SEM observation, it was confirmed that the crystals having grain diameters of about 250 nm or more were formed only in a narrow energy density range from 220 mJ/cm$^2$ to 270 mJ/cm$^2$. The crystals having the grain diameters of 300 nm or more were confirmed only with the energy density of 240 mJ/cm$^2$. In the energy density range of the laser light from 250 mJ/cm$^2$ to 270 mJ/cm$^2$, the half-width with the Raman shift of 520 cm$^{-1}$ was 6 cm$^{-1}$. In the laser energy density from 350 mJ/cm$^2$ to 400 mJ/cm$^2$, separation of the film due to laser light irradiation was found.

The time required for performing 50 times the film formation was 1000 minutes. Boundary cleanability of the finally produced crystalline silicon film and the silicon oxide film was evaluated by impurity analysis with the SIMS, and it was found that the impurity concentration of carbon in the film was $1 \times 10^{17}$ pcs/cm$^3$, but the impurity concentration of carbon in the boundary between the films was $5 \times 10^{18}$ pcs/cm$^3$. The hole mobility was 20 cm$^2$/V·s.

As can be seen from the results of the foregoing practical example and the comparative example, the practical example using the apparatus of the invention can provide the predetermined crystal grain diameter, and allows selection of the laser energy density for crystallization from a wider range than the comparative example, in which the amorphous silicon film is formed by the conventional parallel-plated plasma CVD apparatus, and then the film is crystallized by the laser light irradiation. Further, according to the foregoing practical example, separation or abrasion of the film did not occur even when it was irradiated with the laser beam of a high energy density.

According to the practical example, the formation of the pre-film of the crystalline silicon film and the laser annealing can be successively effected on portions of the substrate starting from its one end, and the silicon oxide film can be formed thereon without losing the vacuum condition. In addition, dehydrogenation is not required before the laser annealing. Therefore, the time required for performing 50 times the film formation can be significantly reduced, compared with the comparative example. It can be understood that the practical example could provide the film-coated substrate having high cleanability in the boundary between the crystalline silicon film and the silicon oxide film, and thus having good electrical characteristics, compared with the comparative example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A film forming apparatus comprising:
   a silicon film forming vacuum chamber for forming a crystalline silicon film on a substrate surface;
   an ion beam emission device provided in said vacuum chamber, for emitting an ion beam to said substrate surface;
   a film forming device provided in said vacuum chamber, for forming a pre-film on said substrate surface at an ion beam emission region;
   an energy beam irradiation device provided in said vacuum chamber for irradiating said pre-film with an energy beam, at an energy beam irradiation region, for crystallizing said pre-film; and
   a substrate transporting device arranged in said vacuum chamber for moving said substrate from the ion beam emission region to the energy beam irradiation region in such a way that the surface of such substrate having said pre-film formed on it, at the ion beam emission region, is able to pass through the energy beam irradiation region while pre-film is being formed on the surface of said substrate moving through the ion beam emission region.

2. The film forming apparatus according to claim 1, wherein said film forming device includes a plasma CVD device for forming said pre-film on said substrate.

3. The film forming apparatus according to claim 2, wherein
   said energy beam irradiating device is a laser light irradiating device and arranged adjacent to said film forming device.

4. The film forming apparatus according to claim 3, wherein
   said energy beam irradiation device includes:
      a laser light source arranged outside a plasma producing chamber of said plasma CVD device,
      an optical system for determining a range irradiated with a laser light emitted from said laser light source,
      a window formed on a wall of said plasma producing chamber for transmission of the laser light from said optical system into said chamber,
      a pass for the laser light for irradiating said substrate with the laser light from said window, including a reflecting mirror and being covered with a protection plate for intercepting the plasma and ion beams.

5. The film forming apparatus according to claim 3, wherein
   said ion source can emit the ion beam with an emission energy of about 100 eV to 1 keV.

6. The film forming apparatus according to claim 3, wherein
   said ion source can emit the ion beam with an emission energy of 500 eV to 10 keV.

7. The film forming apparatus according to claim 1, wherein
   said ion source can emit the ion beam with an emission energy of 100 eV to 1 keV.

8. The film forming apparatus according to claim 1, wherein
   said ion source can emit the ion beam with an emission energy of 500 eV to 10 keV.

9. The film forming apparatus according to claim 1, wherein
   an electrical insulating film forming vacuum chamber for forming an electrical insulating film on the target surface of said substrate is connected to said silicon film forming vacuum chamber via a connection hermetically sealed against an exterior.

10. The film forming apparatus according to claim 1, wherein
    a preheating vacuum chamber for preheating the substrate before the film formation is connected to said silicon film forming vacuum chamber via a connection hermetically sealed against an exterior.

11. The film forming apparatus according to claim 1, wherein
    a preliminary vacuum chamber allowing external transportation of the substrate is connected to said silicon film forming vacuum chamber via a connection hermetically sealed against an exterior.

* * * * *